(12) United States Patent
Kim

(10) Patent No.: US 11,417,391 B2
(45) Date of Patent: Aug. 16, 2022

(54) SYSTEMS AND METHODS FOR LEVEL DOWN SHIFTING DRIVERS

(71) Applicant: Micron Technology, Inc., Boise, ID (US)

(72) Inventor: Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/006,097

(22) Filed: Aug. 28, 2020

(65) Prior Publication Data
US 2022/0068358 A1 Mar. 3, 2022

(51) Int. Cl.
*G11C 11/4093* (2006.01)
*H03K 19/0185* (2006.01)
*H03K 3/356* (2006.01)

(52) U.S. Cl.
CPC .... *G11C 11/4093* (2013.01); *H03K 3/356113* (2013.01); *H03K 19/018521* (2013.01)

(58) Field of Classification Search
CPC .............. G11C 11/4093; G11C 7/1057; H03K 3/356113; H03K 19/018521
USPC .................................................... 365/189.11
See application file for complete search history.

(56) References Cited

U.S. PATENT DOCUMENTS

| | | | |
|---|---|---|---|
| 9,647,660 B1* | 5/2017 | Alam | H03K 19/00361 |
| 9,673,699 B1* | 6/2017 | Viviani | H02M 3/158 |
| 2012/0112799 A1* | 5/2012 | Bae | H04L 25/0272 |
| | | | 327/108 |
| 2020/0042028 A1* | 2/2020 | Deval | G05F 1/59 |
| 2020/0212861 A1* | 7/2020 | Friend | H03F 3/211 |

* cited by examiner

*Primary Examiner* — Huan Hoang
*Assistant Examiner* — Minh Dinh
(74) *Attorney, Agent, or Firm* — Fletcher Yoder, P.C.

(57) ABSTRACT

A memory device includes a level down shifting driver circuit. The level down shifting driver circuit include input circuitry having at least one input port, and a cross-junction circuitry electrically coupled to the input circuitry and configured to receive a first signal from the input circuitry to drive one or more devices included in the cross-junction circuitry. The level down shifting driver circuit further includes an output drive circuitry electrically coupled to the cross-junction circuitry and configured to receive a second signal from the cross-junction circuitry, wherein the output drive circuitry comprises an output line configured to deliver a first voltage output based on a first input voltage received by the input circuitry, and a second voltage output based on a second input voltage received by the input circuitry.

20 Claims, 5 Drawing Sheets

SYSTEMS AND METHODS FOR LEVEL DOWN SHIFTING DRIVERS

BACKGROUND

Field of the Present Disclosure

The present disclosure relates to shifting drivers, and more specifically, to level down shifting drivers.

Description of Related Art

Certain read/write memory devices, such as dynamic random access memory (DRAM), include arrays having memory cells that store information. For example, certain DRAM devices, such as synchronous dynamic RAM (SDRAM) devices may have multiple memory banks having many addressable memory elements or cells included in memory arrays. In use, memory devices, as the SDRAM devices may receive data input signals at high speeds, such as speeds of 1 gigabits per second (Gbps) or more, and store data in the memory cells based on the data input signals. Level shifting drivers may be used, for example, to translate signals from one logic level or voltage domain to another, thus enabling a bridge between domains in processors, logic, sensors, and the like. It would be beneficial to improve the circuitry in level shifting drivers.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines useful in saving and retrieving the bits from the memory bank. In certain DRAM and SDRAM devices, level down shifting drivers may include circuitry that shifts certain signals, e.g., voltage signals, from a certain first voltage range (e.g., 0 to 3.1 volts) to a second lower voltage range (e.g., 1.6 to −1 volt). In certain embodiments, a level down shifting driver may include circuitry that no longer uses feedback in an output line, thus improving a "swing" performance of the level down shifting driver, as further described below.

Figure 1:
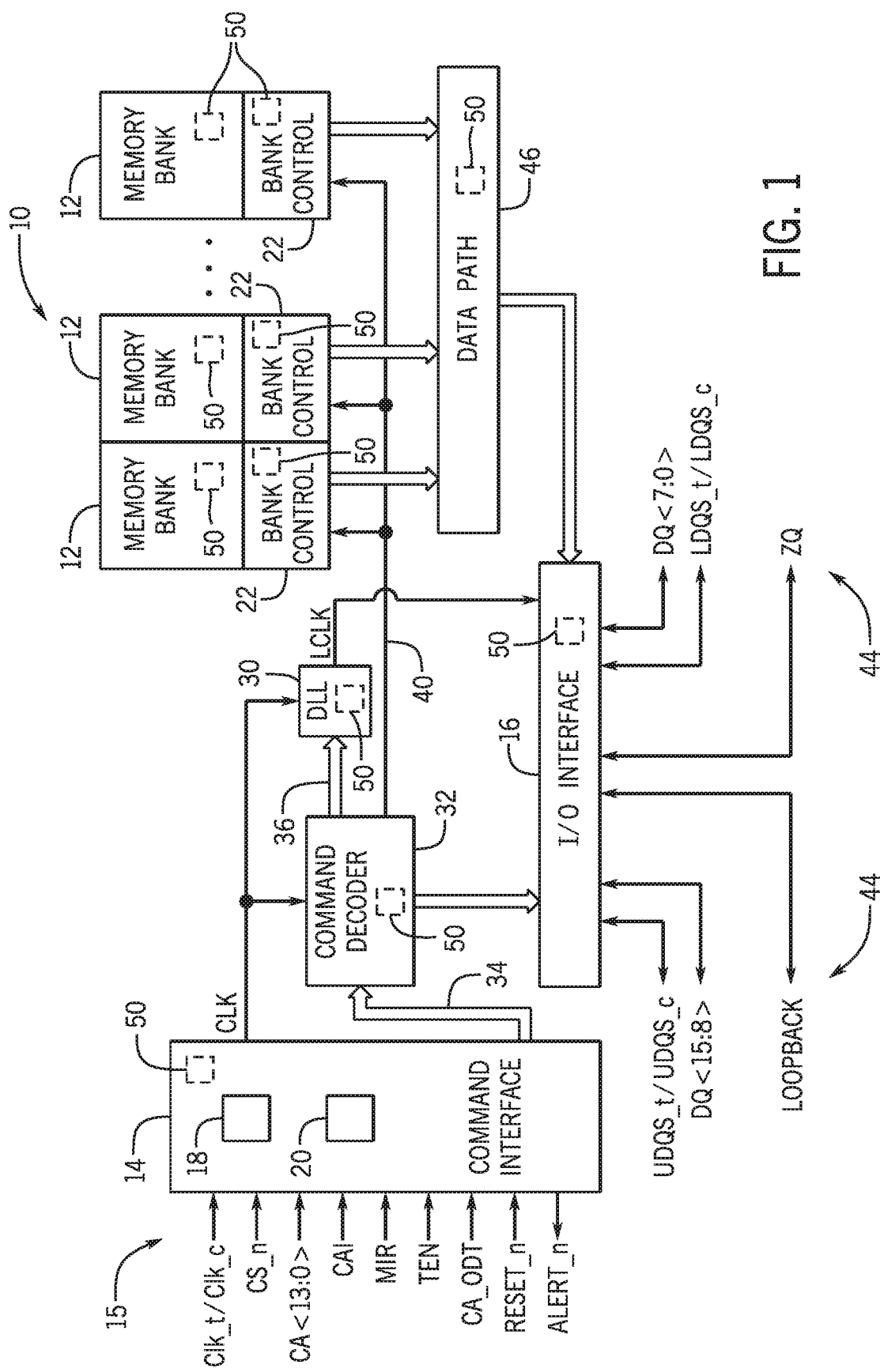
FIG. 1 is a block diagram illustrating an organization of a memory device that may include one or more level down shifting drivers, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface 14 may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance. The data (e.g., IO signals) for read and writes may be addressed to certain memory (e.g., memory cells) in the memory banks 12.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. As will also be appreciated, various components, such as the command interface 14, the command decoder 32, the DLL 30, the I/O interface 16, memory banks 12, bank control 22, and/or data path 46, may include one or more level down shifting driver circuits 50. The level down shifting driver circuits 50 may be unidirectional and may receive as input two signals. For example, either of the two signals may be used to convert a first voltage into a second voltage, the second voltage at a lower voltage level than the first voltage. The conversion may be useful to translate signals from one logic level or voltage domain to another logic level (e.g., low logic level), thus enabling a bridge between domains in components of the memory device 10. Accordingly, it should be understood that the block diagram of FIG. 1 is only provided to highlight certain functional features of the memory device 10 to aid in the subsequent detailed description. It is also to be noted that the level down shifting driver circuits 50 described herein may be useful in other systems, such as microprocessors, sensors, other memory devices, logic circuits, and so on.

Figure 2:
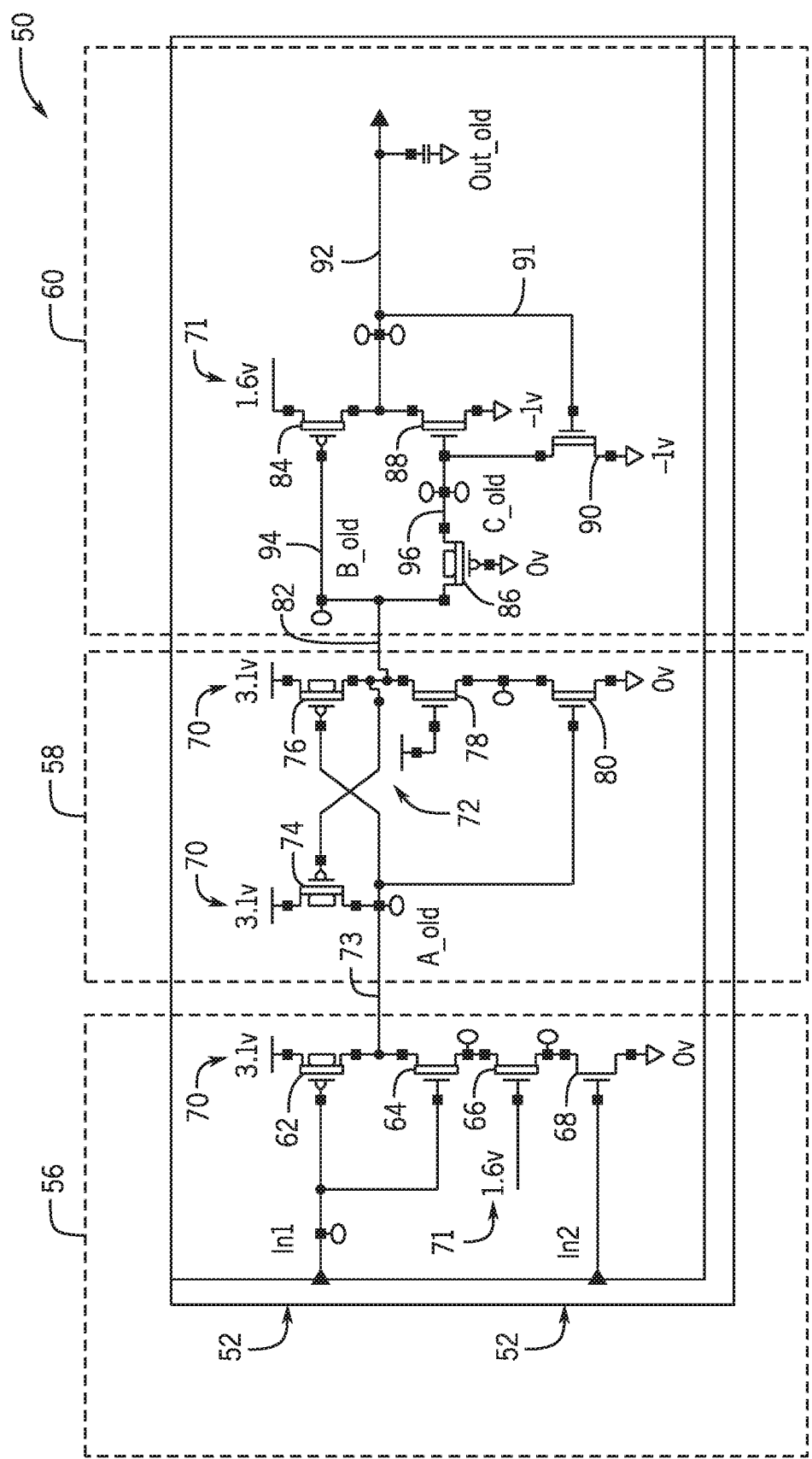
FIG. 2 is a circuit diagram of a level down shifting driver, in accordance with an embodiment.

It would be beneficial to illustrate an embodiment of a level down shifting driver circuit 50. Accordingly, FIG. 2 depicts an embodiment of a level down shifting driver circuit 50 having two input ports 52, 54. It is to be understood that the depicted embodiment is a simplified example only, useful for illustration, and that other level down shifting driver circuits 50 may include more or less components and/or connections. The level down shifting driver circuit 50 may be divided into an input circuitry section 56, a cross-junction circuitry section 58, and an output drive circuitry section 60.

In the depicted embodiment, the input circuitry section 56 may include four inline transistor devices 62, 64, 66, and 68. Transistor 62 may be a P type (e.g., thick gate) metal oxide field effect transistor (MOSFET), transistors 64 and 66 may be N type (e.g., thick gate) MOSFETs, and transistor 66 may be a standard N type MOSFET. As illustrated, the first input 52 may be connected to gates of transistors 62 and 64. The second input 54 may be connected to a gate of transistor 68. Accordingly, input 52 may drive a VCCP power supply 70 (e.g., first pull-up power supply) while input 54 may drive a power supply 71 (e.g., 1.6 volts and second pull-up power supply) connected to transistor 66. The VCCP power supply 70 may provide voltage between 0 to 3.1 volts DC, while the power supply 71 may provide voltage between 0 to 1.1 volts DC. Other voltages may be of between 0 to 5 volts DC for the VCCP power supply 70 and between 0 to 2.5 volts DC for the power supply 71.

In use, input port 52 may be used to drive the level down shifting driver circuit 50 to produce voltages between 1.6 volts and −1 volts based on VCCP input voltages between 0 to 3.1 volts, while input port 54 may be used to drive level down shifting driver circuit 50 to produce voltages between 1.6 volts and −1 volts based on VCC 72 input voltages between 0 to 1.1 volts. That is, either or both of the input ports 52, 54 may trigger the level down shifting driver circuit 50 to produce output voltage. For example, the inputs 52, 54 may be connected to decoder 32 circuitry and outputs of level down shifting driver circuit 50 may be used by a low level decoder (e.g., decoder that uses lower level signals, such as 1.6 volts and −1 volts to decode certain information or commands), thus the level down shifting driver circuit 50 may act as a converter, e.g., logic level down converter. For example, as the input port 52 goes logic high from a logic level low, the level down shifting driver circuit 50 may switch from a logic level low to a logic level high, and vice versa.

In the depicted embodiment, the input circuitry section 56 may then provide voltage through a line 73 into the cross-junction circuitry section 58. The cross junction circuitry section 58 is depicted as having a P type (e.g., thick gate) MOSFET device 74 and a P type (e.g., thick gate) MOSFET device 76 (e.g., first pull-up transistor) in a cross junction configuration. The cross junction circuitry section 58 may also include an N type (e.g., thick gate) MOSFET device 78, and an N type (e.g., thick gate) MOSFET device 80 (e.g., first pull-down transistor) having a drain connected to a first pull-down power supply (e.g., 0 volts). The output voltage of the input circuitry section 56 through line 73 may be used to drive both transistors 76 and 80. The drain of the transistor 76 may in turn drive the gate of the transistor 74, which may then provide current into the gates of transistors 76 and 80, resulting in line 82 driving a gate of a P type (e.g., thick gate) MOSFET device 84 (e.g., second pull-up transistor) included in the output drive circuitry 60. That is, line 82 connects the cross-junction circuitry section 58, e.g., as output of the cross-junction circuitry section 58, which is then provided as input into the output drive circuitry 60.

Output drive circuitry 60 may also include a P type (e.g., thick gate) MOSFET device 86, which in turn has a drain connected to an N type (e.g., thick gate) MOSFET device 88 (e.g., third pull-down transistor). An additional N type (e.g., thick gate) MOSFET device 90 is shown, with a feedback line 91 from output line 92. In use, line 94 may go high when line 96 goes low, thus "swinging" the output line 92 high and low respectively (e.g., between 1.6 volts and −1 volts DC). However, since line 92 also is connected to feedback line 91 and thus with the N type device 90, the swing may not be as pronounced as desired. For example, device 90 would be "on" to send −1 volts DC to line 96 if output line 92 is high, and a swing to 1.6 volts DC may not go as high as desired since output device 94 may be "thick", e.g. over 10 nm, and its source is shown at 1.6 volts DC.

Figure 3:
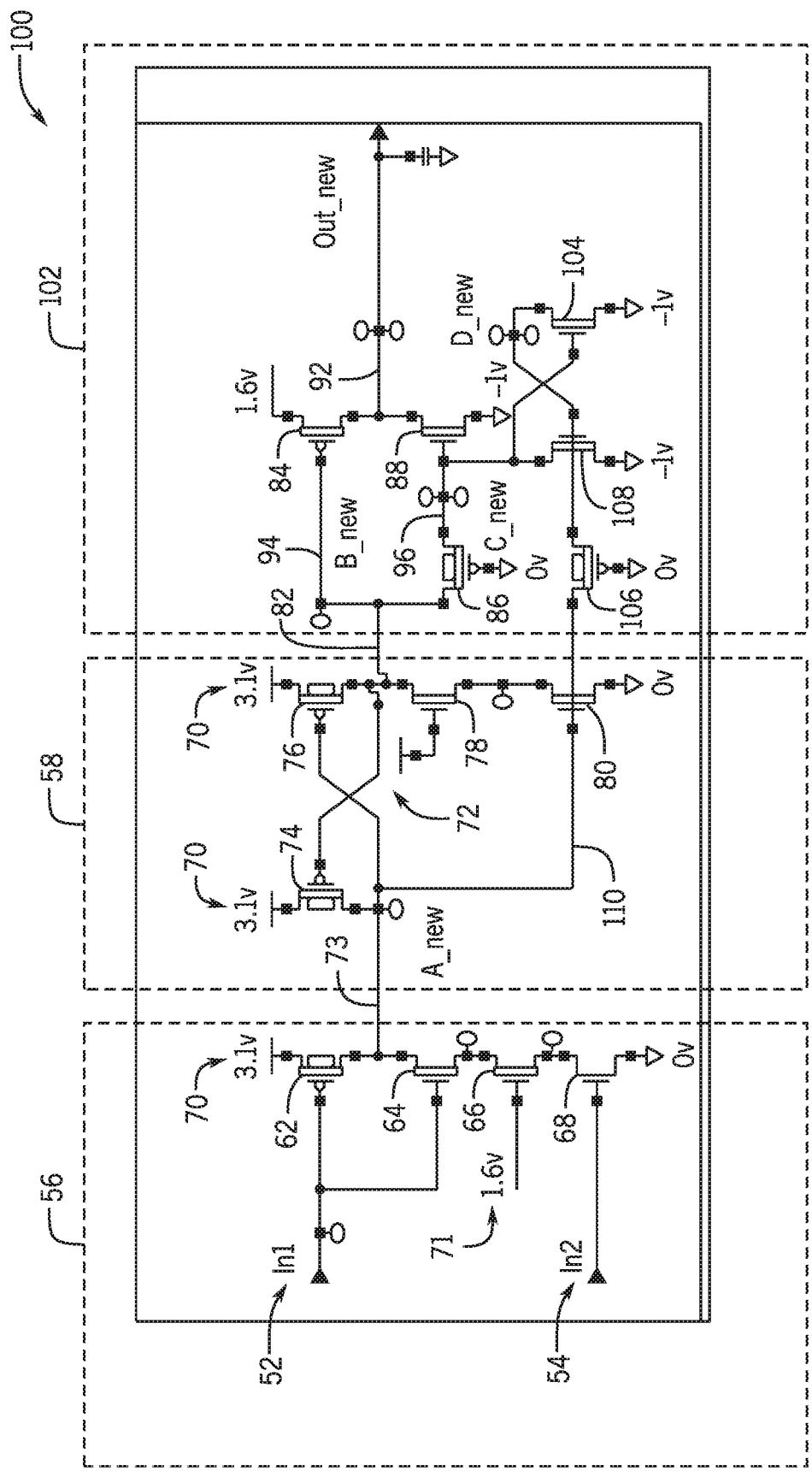
FIG. 3 is a circuit diagram of a level down shifting driver that does not include an output feedback look, in accordance with an embodiment.

Accordingly, a second embodiment of the output drive circuitry 60 has the feedback line 91 removed, as shown in FIG. 3. Turning now to FIG. 3, the figure illustrates an embodiment of a level down shifting circuit 100. It is to be understood that the depicted embodiment is a simplified example only, useful for illustration, and that other level down shifting driver circuits 100 may include more or less components and/or connections. Because the level down shifting driver circuit 100 includes some of the same components as shown in the figure above with respect to the level down shifting driver circuit 50, the same components are illustrated using the same element numbers. The level down shifting driver circuit 100 may be divided into an input circuitry section 56, a cross-junction circuitry section 58, and an output drive circuitry section 102. In certain embodiments, the input circuitry section 56 and the cross-junction circuitry section 58 are the same as those found in the level down shifting driver circuit 100, but the output drive circuitry section 102 may include additional components, for example, to improve time and/or efficiency when switching between the output levels, such as between 1.6 volts DC and −1 volts DC. As shown, line 73 traverses a first input node (e.g., A new), line 94 traverses a first output node (B new), and line 96 traverses a second output node (C new).

As mentioned earlier, the input ports 52 and/or 54 may be used to drive the level down shifting driver circuit 100 to convert input voltages, such as VCCP (e.g., between 0 and 5 volts) via the input port 52 and/or VCC (e.g., between 0 and 2.5 volts) via the input port 54 into lower level outputs, such as between 1.6 volts DC and −1 volts DC. That is, in one embodiment, cycling between 0 and 5 volts VCCP may result in the shifting driver circuit's output cycling between positive and negative voltages, such as between 1.6 volts DC and −1 volts DC, and cycling between 0 and 2.5 volts VCC may also result in the shifting driver circuit's output cycling between positive and negative voltages, such as between 1.6 volts DC and −1 volts DC.

In the illustrated embodiment, the output drive circuitry section 102 includes a total count of three new devices when compared to the output drive circuitry section 60. More specifically, the output drive circuitry section 102 includes an N type MOSFET device 104 and a P type (e.g., thick gate) MOSFET device 106. Additionally, the N type (e.g., thick gate) device 90 is now replaced with a standard N type MOSFET device 108 (e.g., second pull-down transistor) shown as having a drain coupled to a second pull-down power supply (e.g., −1 volts) lower than the first pull-down power supply (e.g., 0 volts). In the illustrated embodiment, the N type device 104 is electrically coupled to the N type device 108 (e.g., second pull-down transistor) via a cross-junction connection. In use, the N type devices 104 and 108 may now more efficiently "swing" the voltage, for example, from −1 volt DC to 1.6 volts DC (or vice versa) by activating the device 88 as opposed to using a feedback line or loop to activate the device 88. Further, line 110 may now directly electrically couple the P type device 106 to the input circuitry 56, further aiding in the improved "swing" performance of the output drive circuitry 102 via line 92 (e.g., third output node). By eliminating the use of a feedback loop to alternate or otherwise swing between output voltages, the techniques described herein may provide for improved performance and efficiency in level down shifting circuitry.

Figure 4:
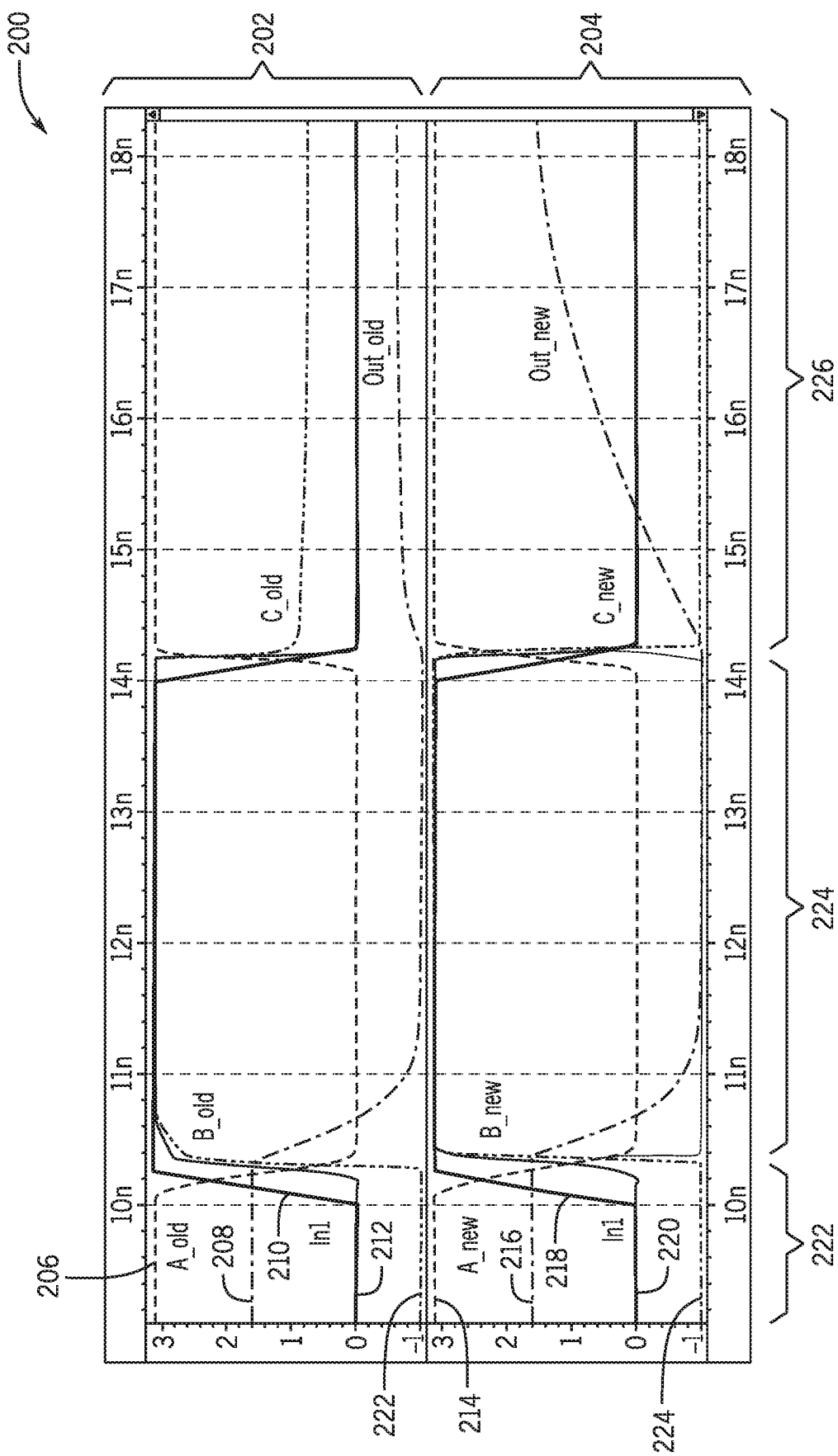
FIG. 4 is timing diagram comparing performance between the level down shifting driver of FIG. 2 and the level down shifting driver of FIG. 3, in accordance with an embodiment.

FIG. 4 illustrates a timing diagram 200 of an embodiment of a series of signals that shows an example comparison of performance between the level down shifting driver circuit 50 and the level down shifting driver circuit 100. In the depicted embodiment, a section 202 shows performance, including switching performance, for the level down shifting driver circuit 50, while a section 204 shows performance, including switching performance, for the level down shifting driver circuit 100. In the depicted embodiment, signal 206 is representative of voltage through line 73 of the level down shifting driver circuit 50 while signal 208 is representative of output voltage through line 92. Also shown are signals 210 and 212, representative of voltages received via the input 52 and of voltages carried by line 94, respectively.

The graph 200 also shows signals 214 and 216. Signal 214 is representative of voltage though line 73 of the level down shifting driver circuit 100, while signal 216 is representative of output voltage through line 94 of the level down shifting driver circuit 100. Signals 218 and 220, as illustrated are representative of voltages received via the input 52 and of voltages carried by line 94, respectively, of the level down shifting driver circuit 100. Signals 222 and 224 are also shown, representative of voltages in lines 96 of the level down shifting driver circuit 50 and of the level down shifting driver circuit 100, respectively.

Section 222 shows the signals 210, 218 starting at a logic low (e.g., 0 volts DC) and then going to a logic high (e.g., 3.1 volts). When the signals 210, 218 are logic low, the output signals 208, 216, are at logic high (e.g., 1.6 volts), for example because of signals 206, 212, 222 in the case of the level down shifting driver circuit 50 and because of signals 214, 220, 224 in the case of level down shifting driver circuit 100. Section 224 shows the signals 210, 218 now fully at logic high (e.g., 3.1 volts DC), and the corresponding output signals 208, 216 now fully at logic low (e.g., −1 volts DC).

Section 226 shows the swing performance of the level down shifting driver circuit 50 as it compares to the level down shifting driver circuit 100. As the input 52 voltage goes logic low (e.g., 0 volts DC), the signals 208, 216 now go to logic high. However, signal 208 is shown as not going as high as desired, and taking longer to do so, for example, when compared to signal 216. Indeed, the signal 224, for example, shows a lower voltage for logic high when compared to the voltage of signal 222. Accordingly, a faster swing performance and a higher achievable voltage of the signal 216 when compared to the signal 208 is shown, due to the changes to the level down shifting driver circuit 100. In this manner, the level down shifting driver circuit 100 may more quickly and efficiently perform a switch, for example, when compared to level down shifting driver circuit 50.

Figure 5:
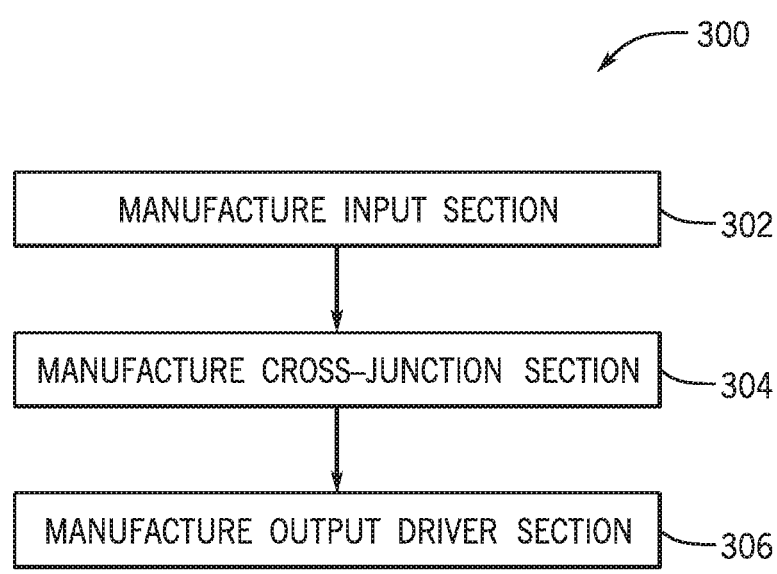
FIG. 5 is a flow chart of a process suitable for manufacturing level down shifting drivers, in accordance with an embodiment.

FIG. 5 is flowchart illustrating an embodiment of a process 300 suitable for manufacturing a level down shifting driver circuit. It is to be understood that the steps shown for the process 300 may be performed in any order, including in parallel order. In the depicted embodiment, the process 300 may first manufacture (block 302) the input circuitry section 60. For example, the inputs 52, 54 may be manufactured as input ports, and the devices 62, 64, 66, 68 may be manufactured and/or electrically connected. In certain embodiments, the manufacturing of the input circuitry section 60 may be part of manufacturing a memory device, such as the memory device 10.

The process 300 may then manufacture (block 304) the cross junction circuitry section 58. As illustrated in FIGS. 2 and 3, the cross-junction circuitry section 58 may include devices 74, 75, 78, and 80, with the devices 74 and 76 manufactured in a cross junction configuration. The manufacturing (block 304) of the cross junction circuitry section 58 may additionally include electrically connecting the cross-junction circuitry section 58 to the input circuitry section 60.

The process 300 may then manufacture (block 306) the output driver circuitry, such as sections 60 or sections 102 depending on which level down shifting driver circuit is to be manufactured, e.g. level down shifting driver circuit 50 and/or 100. Manufacturing the output driver circuitry 102 may include substantially the same steps as manufacturing the output driver circuitry 60, but with two additional devices 104, 108 in a cross-junction configuration, and the new device 106. The output driver circuitry may then be electrically coupled to the cross-junction circuitry section 58 and/or the input circuitry section 56. The resulting level down shifting driver circuits 50 and/or 100 may then be used to provide for variety of signal processing functions, such as when transforming signals from a first voltage domain into a second lower voltage domain.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
    a level down shifting driver circuit, comprising:
        an input circuitry having at least one input port;
        a first cross-junction circuitry electrically coupled to the input circuitry and configured to receive a first signal from the input circuitry to drive one or more devices included in the first cross-junction circuitry, wherein the one or more devices are electrically coupled via a cross-junction; and
        an output drive circuitry electrically coupled to the first cross-junction circuitry and configured to receive a second signal from the first cross-junction circuitry, wherein the output drive circuitry comprises an output line configured to deliver a first voltage output based on a first input voltage received by the input circuitry, and a second voltage output based on a second input voltage received by the input circuitry, wherein the first or the second voltage outputs are at a lower voltage than the first or the second input voltages, wherein the output line does not include a feedback loop, and wherein the output drive circuitry comprises a second cross-junction circuitry electrically coupled to the input circuitry and configured to aid in transitioning the output line from the first voltage output to the second voltage output.

2. The memory device of claim 1, wherein the input circuitry comprises a first and a second input port, wherein the first input voltage is received via the first input port and wherein the second input voltage is received via the second input port.

3. The memory device of claim 2, wherein the first input port is electrically coupled to drive a P-type device included in the input circuitry to deliver the first input voltage via a drain of the P-type device.

4. The memory device of claim 3, wherein the second input port is electrically coupled to drive an N-type device included in the input circuitry and positioned downstream from the drain of the P-type device.

5. The memory device of claim 1, wherein the one or more devices included in the first cross-junction circuitry comprise a first P-type device electrically coupled to a second P-type device via the cross junction.

6. The memory device of claim 5, wherein the first P-type device is electrically coupled to the input circuitry via an input circuitry output line electrically coupling the input circuitry to a gate of the first P-type device.

7. The memory device of claim 1, wherein the output drive circuitry comprises a first N-type device electrically coupled to a second N-type device via a second cross-junction.

8. The memory device of claim 7, wherein the output drive circuitry comprises a first P-type device electrically coupled to the first cross-junction circuitry and to at least one of the first or the second N-type devices.

9. The memory device of claim 1, wherein the first input voltage is between 0 and 5 volts DC, the second input voltage is between 0 and 2.5 volts DC, the first voltage output is a positive DC voltage and the second voltage output is a negative DC voltage.

10. A method for manufacturing a level down shifting driver circuit, comprising:
    manufacturing an input circuitry having at least one input port;
    manufacturing a first cross-junction circuitry electrically coupled to the input circuitry and configured to receive a first signal from the input circuitry to drive one or more devices included in the first cross-junction circuitry, wherein the one or more devices are electrically coupled via a cross-junction; and
    manufacturing an output drive circuitry electrically coupled to the first cross-junction circuitry and configured to receive a second signal from the first cross-junction circuitry, wherein the output drive circuitry comprises an output line configured to deliver a first voltage output based on a first input voltage received by the input circuitry, and a second voltage output based on a second input voltage received by the input circuitry, wherein the first or the second voltage outputs are at a lower voltage than the first or the second input voltages, wherein the output line does not include a feedback loop, and wherein the output drive circuitry comprises a second cross-junction circuitry electrically coupled to the input circuitry and configured to aid in transitioning the output line from the first voltage output to the second voltage output.

11. The method of claim 10, wherein the output drive circuitry comprises a first N-type device electrically coupled via a second cross-junction to a second N-type device included in the output drive circuitry.

12. The method of claim 11, wherein the output drive circuitry comprises a first P-type device electrically coupled to the first cross-junction circuitry and to at least one of the first or the second N-type devices.

13. The method of claim 12, wherein the first P-type device comprises a thick gate P-type device.

14. The method of claim 10, wherein the level down shifting driver circuit is manufactured as a component included in a memory device during manufacturing of the memory device.

15. The method of claim 10, wherein the input circuitry comprises a first and a second input port, wherein the first input voltage is received via the first input port and wherein the second input voltage is received via the second input port.

16. A level down shifting driver circuit, comprising:
    a first pull-up power supply;
    a second pull-up power supply lower than the first pull-up power supply;
    a first pull-down power supply;
    a second pull-down power supply lower than the first pull-down power supply;
    a cross-junction circuitry including:
        a first input node,
        a first output node,
        a first pull-up transistor coupled between the first pull-up power supply and the first output node, a gate of the first pull-up transistor being coupled to the first input node; and
        a first pull-down transistor coupled between the first pull-down power supply and the first output node, a gate of the first pull-down transistor being coupled to the first input node;

a level shifting circuitry including:
- a second output node,
- a second pull-down transistor coupled between the second pull-down power supply and the second output node, a gate of the second pull-down transistor being coupled to the first input node; and an output device circuitry including:
- a third output node;
- a second pull-up transistor coupled between the second pull-up power supply and the third output node, a gate of the second pull-up transistor being coupled to the second output node; and
- a third pull-down transistor coupled between the second pull-down power supply and the third output node, a gate of the third pull-down transistor being coupled, at least in part, to the second output node.

17. The level down shifting driver circuit of claim 16, comprising a first and a second input port, wherein the output device circuitry outputs via the third output node a lower level voltage than voltages received via the first or the second input ports.

18. The level down shifting driver circuit of claim 17, wherein the first and second input ports are included in an input circuitry connected to the cross-junction circuitry via the first input node.

19. The level down shifting driver circuit of claim 16, wherein the third output node does not include a feedback loop.

20. The level down shifting driver circuit of claim 16, wherein the level down shifting driver circuit is included in a memory device.

* * * * *